US010381101B2

(12) United States Patent
Majumdar et al.

(10) Patent No.: US 10,381,101 B2
(45) Date of Patent: *Aug. 13, 2019

(54) NON-CONTACT MEASUREMENT OF MEMORY CELL THRESHOLD VOLTAGE

(71) Applicant: Micron Technology, Inc., Boise, ID (US)

(72) Inventors: Amitava Majumdar, Boise, ID (US); Rajesh Kamana, Boise, ID (US); Hongmei Wang, Boise, ID (US); Shawn D. Lyonsmith, Boise, ID (US); Ervin T. Hill, Boise, ID (US); Zengtao T. Liu, Eagle, ID (US); Marlon W. Hug, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/849,262

(22) Filed: Dec. 20, 2017

(65) Prior Publication Data

US 2019/0189237 A1    Jun. 20, 2019

(51) Int. Cl.
| *G11C 29/56* | (2006.01) |
| *G11C 29/50* | (2006.01) |
| *G11C 13/00* | (2006.01) |
| *H01L 21/66* | (2006.01) |
| *H01L 45/00* | (2006.01) |

(Continued)

(52) U.S. Cl.
CPC .... *G11C 29/50004* (2013.01); *G11C 13/0004* (2013.01); *G11C 13/0069* (2013.01); *G11C 29/56* (2013.01); *H01L 22/14* (2013.01); *H01L 27/2463* (2013.01); *H01L 45/06* (2013.01); *H01L 45/144* (2013.01); *G11C 13/0026* (2013.01); *G11C 13/0028* (2013.01); *G11C 2013/0078* (2013.01); *G11C 2029/0403* (2013.01); *G11C 2029/5004* (2013.01); *G11C 2213/71* (2013.01); *G11C 2213/72* (2013.01); *H01L 27/2427* (2013.01); *H01L 45/1608* (2013.01)

(58) Field of Classification Search
CPC ............... G11C 13/0004; G11C 13/50004
USPC ........................ 365/148, 201, 148.201
See application file for complete search history.

(56) References Cited

U.S. PATENT DOCUMENTS 6,049,495 A * 4/2000 Hsu ............... G11C 11/404
                                                365/189.09
7,319,623 B1 * 1/2008 Yuan ............. H01L 27/1052
                                                257/E21.645

(Continued)

*Primary Examiner* — Hoai V Ho
*Assistant Examiner* — Muna A Techane
(74) *Attorney, Agent, or Firm* — Holland & Hart LLP

(57) ABSTRACT

Methods, systems, and devices for non-contact measurement of memory cell threshold voltage, including at one or more intermediate stages of fabrication, are described. One access line may be grounded and coupled with one or more memory cells. Each of the one or more memory cells may be coupled with a corresponding floating access line. A floating access line may be scanned with an electron beam configured to set the floating access line to a particular surface voltage at the scanned bit line, and the threshold voltage of the corresponding memory cell may be determined based on whether setting the scanned bit line to the surface voltage causes a detectable amount current to flow through the corresponding memory cell.

3 Claims, 12 Drawing Sheets

(51) Int. Cl.
*H01L 27/24* (2006.01)
*G11C 29/04* (2006.01)

(56) References Cited

U.S. PATENT DOCUMENTS

| | | | | |
|---|---|---|---|---|
| 8,576,607 B1* | 11/2013 | Nemati | ................... | G11C 11/39 365/105 |
| 2003/0185047 A1* | 10/2003 | Khouri | ............... | G11C 13/0004 365/163 |
| 2011/0261616 A1* | 10/2011 | Kim | ................... | G11C 13/0004 365/163 |
| 2013/0121057 A1* | 5/2013 | Le Neel | ............. | G11C 13/0069 365/148 |

* cited by examiner

Access Line 115

Other Material 705

NON-CONTACT MEASUREMENT OF MEMORY CELL THRESHOLD VOLTAGE

BACKGROUND

The following relates generally to operating a memory array and more specifically to non-contact measurement of memory cell threshold voltage.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Some memory devices may include memory cells that exhibit a threshold voltage, and writing a state to the memory cell may include generating a voltage across the memory cell in excess of the threshold voltage. Devices and techniques for determining the threshold voltage of one or more memory cells may be desired.

DETAILED DESCRIPTION

Figure 1:
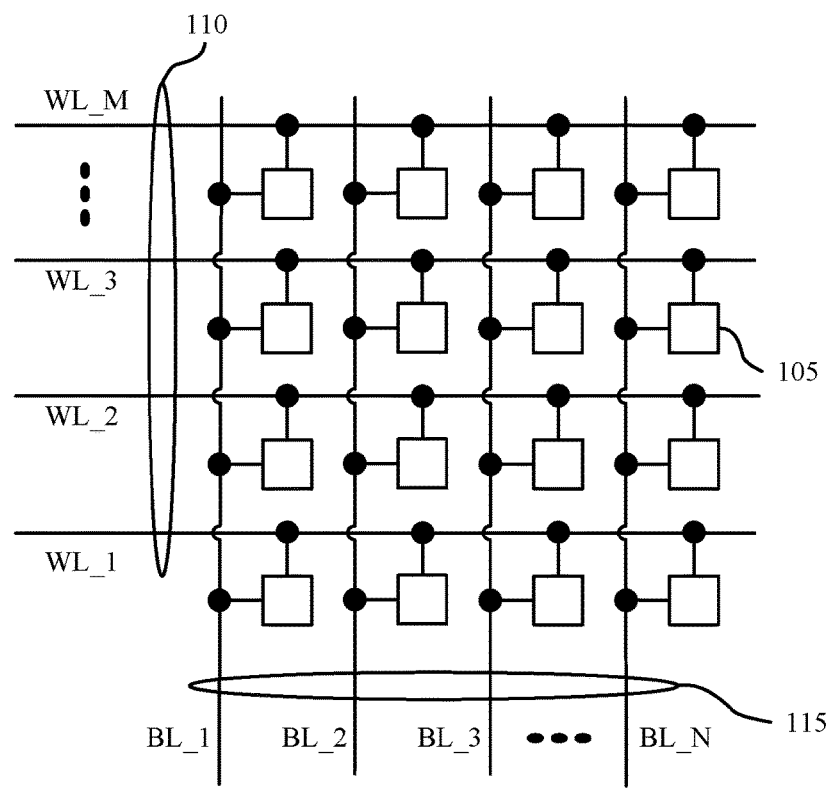
FIG. 1 illustrates an example of an apparatus that supports non-contact measurement of memory cell threshold voltage in accordance with embodiments of the present disclosure.

Designers and manufacturers of memory devices may wish to test various aspects of their memory devices, for example, for quality control purposes or as part of the design process. For example, some memory devices may include memory cells that exhibit a threshold voltage (Vth), and writing a state to the memory cell may include generating a voltage across the memory cell that exceeds Vth. Testing of Vth for such memory cells may be desired to verify or refine device designs or device fabrication processes. Some techniques for testing Vth may require that fabrication of a memory device be complete prior to testing, which may delay the acquisition of useful information and thus may increase design and manufacturing timelines and costs. Other techniques for testing Vth may also require physically probing of a memory device with electrodes, which may be problematic for some device structures (e.g., structures with small physical dimensions or intervening materials that inhibit access to memory cells).

The devices and techniques described herein may allow Vth for one or more memory cells to be measured without contacting (e.g., physically contacting) a memory device with a physical probe, among other advantages. For example, the devices and techniques described herein may allow Vth for one or more memory cells to be measured without the use of specialized contact structures for physical probes, such as bond pads. The devices and techniques described herein may also, for example, allow Vth for one or more memory cells to be measured—which may include measuring variation in Vth among the one or more memory cells—at an intermediate fabrication step for a wafer (e.g., a fabrication step at which one or more access lines for the memory cells are exposed at an upper surface of the wafer), thereby reducing time to information for engineers and other personnel.

Further, the devices and techniques described herein may be suitable for device structures that are problematic (e.g., structures that are too small, too rough, have too many layers, or have layers with interfering characteristics) for one or more other Vth measurement techniques or lead to inaccurate results. The devices and techniques described herein may have benefits such as increasing reliability of memory devices, reducing design or manufacturing costs of memory devices, or reducing design or manufacturing time of memory devices, along with other benefits that may be appreciated by one of ordinary skill.

In some cases, Vth may represent a point in the current-voltage (I-V) curve of an element (e.g., a selection element or storage element) within a memory cell that corresponds to a detectable decrease in cumulative resistance of the memory cell, beyond which current may pass through the memory cell and configure the storage cell to store a desired state (e.g., a logic "1" or a logic "0"). For example, the element within the memory cell may in some cases exhibit characteristics of a snapback diode, and Vth may correspond to a snapback point (e.g., point of negative resistance) on the I-V curve of the element. The memory cell may be coupled with a first corresponding access line and a second corresponding access line, and generating a voltage across the memory cell that exceeds Vth may comprise generating a voltage differential between the first corresponding access line and the second corresponding access line that exceeds Vth. For clarity, the first corresponding access line and the second corresponding access line may be referred to herein as a word line and a bit line respectively, but an access line may serve as a word line for one memory cell and as a bit line for another memory cell, and the techniques described herein may be applied to access lines generally.

In some cases, to facilitate non-contact testing of Vth for one or more memory cells, one word line may be grounded (e.g., coupled with a ground reference) and coupled with the one or more memory cells. For example, the grounded word line may be electrically coupled with a substrate of a wafer (e.g., a silicon wafer), which may also be referred to as a bulk of the wafer, and the substrate of the wafer may serve as or may itself be coupled with the ground reference. The grounded word line may be directly coupled with the substrate (e.g., hardwired to the substrate through a low-resistance connection), or the grounded word line may be indirectly coupled with the substrate through a driver circuit. In some cases, the driver circuit may have any number of transistors, diodes, resistors or other electrical components configured to allow current to flow in at least one direction between the grounded word line and the substrate.

Each of the one or more memory cells coupled with the grounded word line may also be coupled with a corresponding floating bit line, and the one or more bit lines may be scanned with an electron beam. The electron beam may be configured to generate a voltage differential between a scanned bit line and the grounded word line by creating a surface voltage at the scanned bit line. Vth of a corresponding memory cell may be determined based at least in part on setting the scanned bit line to the surface voltage. For example, if setting the scanned bit line to the surface voltage causes a detectable amount current to flow through the corresponding memory cell, then Vth may be determined as less than the surface voltage, and if setting the scanned bit line to the surface voltage does not cause a detectable amount of current to flow through the corresponding memory cell, then Vth may be determined as less than the surface voltage.

In some cases, image analysis may be utilized to determine whether setting the scanned bit line to the surface voltage causes current to flow through the corresponding memory cell. For example, an electron beam inspector (EBI) may use voltage contrasting techniques to determine whether setting the scanned bit line to the surface voltage causes current to flow through the corresponding memory cell—e.g., a memory cell though which current flows when the corresponding bit line is set to the surface voltage may appear as having a first brightness (e.g., being relatively bright in an EBI image) whereas a memory cell though which current does not flow when the corresponding bit line is set to the surface voltage may appear as having a second brightness lower than the first brightness (e.g., being relatively dark in the EBI image).

Features of the disclosure introduced above are further described below in the context of an example of an apparatus that includes a plurality of memory cells for which Vth may be measured, with reference to FIG. 1, an example of a circuit that includes a single memory cell for which Vth may be measured, with reference to FIG. 2, and an example of an I-V curve for a material that may be included within a memory cell for which Vth may be measured, with reference to FIG. 3. Additional specific examples of apparatuses for non-contact measurement of Vth for one or more memory cells are then described with reference to FIGS. 4 and 5, and specific examples of processes for non-contact testing of Vth are then described with reference to FIGS. 6 and 7. These and other features of the disclosure are then further illustrated by and described with reference to apparatus diagrams, system diagrams, and flowcharts that relate to non-contact measurement of memory cell threshold voltage.

FIG. 1 illustrates aspects of an example apparatus 100 that supports non-contact measurement of memory cell threshold voltage in accordance with various embodiments of the present disclosure. Apparatus 100 may also be referred to as a memory device or an electronic memory apparatus. Apparatus 100 may include memory cells 105, word lines 110, and bit lines 115.

Memory cells 105 may be programmable to store different states. For example, each memory cell 105 may be programmable to store two states (e.g., a logic 0 or a logic 1). Alternatively, each memory cell 105 may be configured to store more than two logic states.

According to the example of apparatus 100, each row of memory cells 105 is connected to a single word line 110, and each column of memory cells 105 is connected to a single bit line 115. Each memory cell 105 may correspond to a cross point of one word line 110 and one bit line 115, and apparatus 100 may be one example of a cross point architecture. Such a cross point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selection. For example, DRAM may use a transistor, which is a three-terminal device, as the selection component for each memory cell and may have a larger memory cell area compared to a cross point architecture Operations such as reading and writing may be performed on a memory cell 105 by activating or selecting (e.g., applying a voltage to) the corresponding word line 110 and corresponding bit line 115 corresponding to the memory cell. Bit lines 115 may also be known as digit lines, and "access line" or "select line" may generically refer to either a word line 110 or a bit line 115. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

In the example depicted in FIG. 1, apparatus 100 includes one deck of memory cells 105 and may thus be considered a two-dimensional (2D) memory array; however, the number of decks is not limited. A three-dimensional (3D) memory array may include multiple 2D memory arrays formed on top of one another. This may increase the number of memory cells 105 that may be placed or created on a single die or substrate as compared with 2D arrays, which in turn may reduce production costs or increase the performance of the memory array, or both. Memory device 100 may include any number of decks, and each deck may be aligned or positioned so that memory cells 105 may be approximately aligned with one another across each deck. Additionally, for example, decks in a 3D memory array may have common conductive lines such that a single access line may function as a bit line 115 for memory cells 105 in a lower deck and as a word line 110 for memory cells in a higher deck, or vice versa.

Various techniques may be used to form materials or components of apparatus 100. These may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

Memory cells 105 may include one or more elements comprising variable resistance material. Variable resistance materials may refer to various material systems, including, for example, metal oxides, chalcogenides, and the like. Chalcogenide materials are materials or alloys that include at least one of the elements sulfur (S), tellurium (Te), or Se. Many chalcogenide alloys may be possible—for example, a germanium-antimony (Sb)—tellurium alloy (Ge—Sb—Te) is a chalcogenide material. Other chalcogenide alloys not expressly recited here may also be employed.

Memory cells 105 may also be phase change memory cells. Phase change memory exploits the large resistance contrast between crystalline and amorphous states in phase change materials, which may be chalcogenide materials. A material in the crystalline state may have atoms arranged in a periodic structure, which may result in a relatively low electrical resistance (e.g., set state). By contrast, material in an amorphous state may have no or relatively little periodic atomic structure, which may have a relatively high electrical resistance (e.g., reset state). The difference in resistance values between amorphous and crystalline states of a material may be significant; for example, a material in an amorphous state may have a resistance one or more orders of magnitude greater than the resistance of the material in its crystalline state. In some cases, the amorphous state may have a threshold voltage associated with it and current may not flow until Vth is exceeded. In other cases, the material may be partially amorphous and partially crystalline, and the resistance may be of some value between the resistances of the material in a wholly crystalline or wholly amorphous state. So a material may be used for other than binary logic applications—i.e., the number of possible states stored in a material may be more than two.

As explained in more detail with reference to FIG. 3, to set a low-resistance state, a memory cell 105 may be heated by passing a current through the memory cell 105. Heating caused by electrical current flowing through a material that has a finite resistance may be referred to as Joule or ohmic heating. Joule heating may thus be related to the electrical resistance of electrodes or phase change material. Heating the phase change material to an elevated temperature (but below its melting temperature) may result in the phase change material crystallizing and forming the low-resistance state. The current may result from applying a voltage to the memory cell 105, where the applied voltage is based on Vth for the memory cell 105. For example, if the memory cell 105 is in a reset state, current may not flow through the memory cell 105 unless the applied voltage is greater than Vth.

As also explained in more detail with reference to FIG. 3, to set a high-resistance state, the phase change material may be heated above its melting temperature, for example, by Joule heating. The amorphous structure of the molten material may be locked in by abruptly removing the applied current to quickly cool the phase change material, which may be known as "quenching."

In some cases, apparatus 100 may be configured to facilitate non-contact measurement of Vth for one or more memory cells 105. As explained in more detail below, one of the word lines 110 may be coupled with a ground reference and other word lines 110 may be floating (e.g., not coupled with the ground reference or with any other voltage source). The bit lines 115 may also be floating. Thus, each memory cell 105 coupled with the grounded word line 110 may be coupled with one floating bit line 115. As also explained in more detail below, the floating bit lines 115 may then be scanned with an electron beam configured to set a scanned bit line 115 to a surface voltage, and Vth of the memory cells 105 may be determined (e.g., evaluated or measured) based at least in part on whether the corresponding bit line 115 becomes coupled with the ground reference when scanned.

Figure 2:
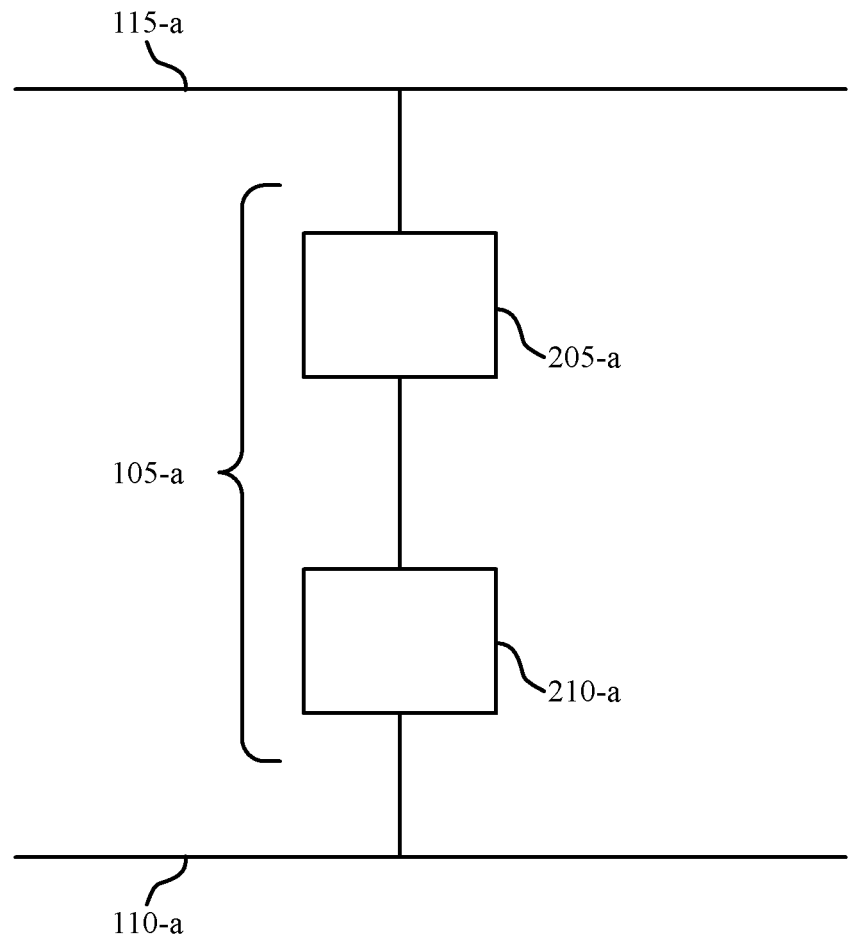
FIG. 2 illustrates an example of a circuit that supports non-contact measurement of memory cell threshold voltage in accordance with embodiments of the present disclosure.

FIG. 2 illustrates an example of a circuit 200 that supports non-contact measurement of memory cell threshold voltage in accordance with various embodiments of the present disclosure. Circuit 200 includes a memory cell 105-a, word line 110-a, and bit line 115-a, which may be examples of a memory cell 105, word line 110, and bit line 115, respectively, as described with reference to FIG. 1.

The memory cell 105-a may include a storage cell 205-a and a selector device 210-a. The storage cell 205-a and the selector device 210-a may be arranged in series. The memory cell 105-a may be coupled with the word line 110-a and the bit line 115-a. In the example circuit 200, the selector device 210-a is coupled with the word line 110-a, and the storage cell 205-a is coupled with the bit line 115-a. In other examples, the positions of the storage cell 205-a and the selector device 210-a may be switched, and the storage cell 205-a may be coupled with the word line 110-a, and the selector device 210-a may be coupled with the bit line 115-a.

The storage cell 205-a may be programmable to store one or more logic states (e.g., a logic "1" or a logic "0"). In some cases, the storage cell 205-a may comprise a chalcogenide or phase change material, such as germanium-antimony-tellurium (GeSbTe). For example, the storage cell 205-a may comprise $Ge_2Sb_2Te_5$. The resistance of storage cell 205-a may depend on whether it is in an amorphous or crystalline state, and one of the amorphous or crystalline state may correspond to a logic "1" while the other of the amorphous or crystalline state may correspond to a logic "0." The storage cell 205-a may be switched from amorphous to crystalline and vice versa—and thus a state may be written to the memory cell 105-a—by passing current through storage cell 205-a so as to heat storage cell 205-a beyond melting temperature for a duration corresponding to the desired state (e.g., amorphous or crystalline, as a duration beyond some threshold may result in crystallization). Heating and quenching of the storage cell 205-a may be accomplished by controlling current flow through the memory cell 105-a, which in turn may be accomplished by controlling the voltage differential between the bit line 115-a and the word line 110-a, as also explained in more detail in reference to FIG. 3.

The selector device 210-a may also comprise a chalcogenide or phase change material, such as GeSbTe, and may in some cases comprise $Ge_2Sb_2Te_5$. In some cases, the selector device 210-a may be maintained in an amorphous state and may behave like a snapback diode, as also explained in more detail in reference to FIG. 3.

Further, although the example of circuit 200 shows memory cell 105-*a* as comprising a storage cell and selector device 210 as two separate elements within the memory cell 105-*a*, the structures and techniques described herein may also be applied to memory cells 105 comprising only a single element (e.g., a self-selecting storage element, a chalcogenide element, or a threshold element).

In some cases, circuit 200 may be configured to facilitate non-contact measurement of Vth for memory cells 105-*a*. As explained in more detail below, the word line 110-*a* may be coupled with a ground reference, and the bit line 115-*a* may be floating (e.g., not coupled with the ground reference or with any other voltage source). As also explained in more detail below, the bit line 115-*a* may be scanned with an electron beam configured to set the bit line 115-*a* to a surface voltage, and Vth of the memory cell 105-*a* may be determined (e.g., evaluated or measured) based at least in part on whether the bit line 115-*a* becomes coupled with the word line 110-*a* (and thus with the ground reference) when scanned. Circuit 200 may be an example of an apparatus for measuring Vth for a single memory cell 105 or may be replicated and included in an apparatus for measuring Vth for any number of memory cells 105, in some examples.

Figure 3:
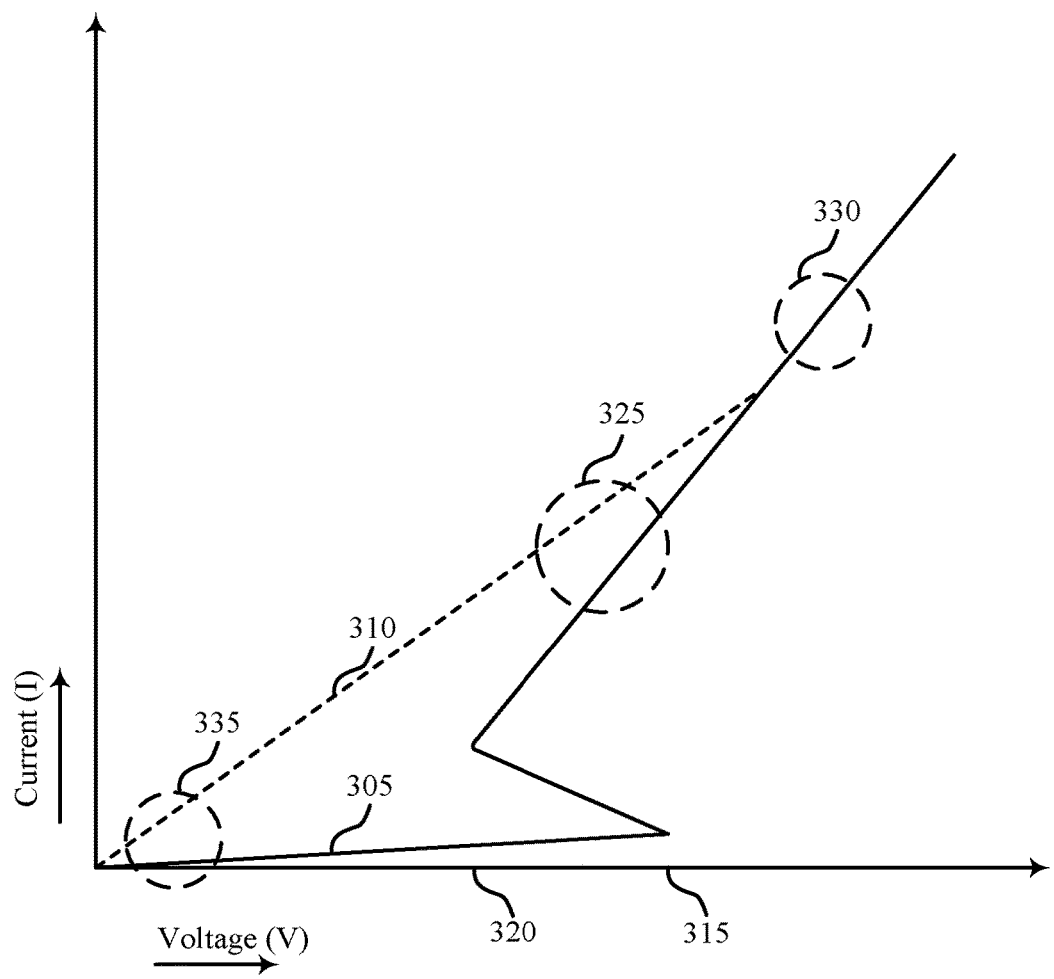
FIG. 3 illustrates an example of an I-V curve for a memory cell that supports non-contact measurement of memory cell threshold voltage in accordance with embodiments of the present disclosure.

FIG. 3 illustrates an example of an example I-V curve 300 for a chalcogenide material that supports non-contact measurement of memory cell threshold voltage in accordance with various embodiments of the present disclosure. I-V curve 300 may in some cases represent an I-V curve for either a storage cell 205 or a selector device 210, such as the storage cell 205-*a* and the selector device 210-*a* of circuit 200, or an I-V curve for an element within a single-element memory cell 105.

In I-V curve 300, solid curve 305 may illustrate the I-V characteristics of a chalcogenide material in an amorphous state, and dashed curve 310 may illustrate the I-V characteristics of the chalcogenide material in a crystalline state. The horizontal axis may correspond to the voltage across the chalcogenide material, and the vertical axis may correspond to the current through the chalcogenide material.

Voltage 315 may correspond to Vth for the chalcogenide material. As shown by solid curve 305, if the chalcogenide material is in the amorphous state, and the voltage across the chalcogenide material increases from zero to a value less than voltage 315, relatively little increase in current may occur. That is, when the chalcogenide material is in the amorphous state, and the voltage across the chalcogenide material increases from zero to a value below voltage 315, the chalcogenide material may exhibit a relatively high resistance.

If the chalcogenide material is in the amorphous state, and the voltage across the chalcogenide material increases from less than voltage 315 to greater than voltage 315, the current through the chalcogenide material may increase rapidly. As the current through the chalcogenide material increases, the voltage across the chalcogenide material may decrease until the voltage reaches voltage 320. That is, the chalcogenide material may exhibit a negative resistance until the voltage reaches voltage 320, which may be referred to as a snapback event, after which the chalcogenide material may again exhibit a positive resistance as indicated by the upper portion of solid curve 305, and the voltage may recover to voltage 315 and beyond.

In some cases, the chalcogenide material may be switched from the amorphous state to a crystalline state by setting the voltage across the chalcogenide material (and thus the current through the chalcogenide material) to a level within set region 325, which may increase the temperate of the chalcogenide material beyond a crystallization temperature, for a temporal duration long enough for crystallization to occur. If the chalcogenide material is in the crystalline state, as shown by dashed curve 310, the chalcogenide material may exhibit a positive ohmic (e.g., linear) resistance. The chalcogenide material may be switched from the crystalline state to the amorphous state by setting the voltage across the chalcogenide material (and thus the current through the chalcogenide material) to a level within reset region 330, which may increase the temperate of the chalcogenide material beyond a melting temperature, and then removing the voltage/current sufficiently abruptly (e.g., applying the voltage/current for only a relatively brief temporal duration such that crystallization does not occur).

As shown by dashed curve 310, the positive resistance exhibited by the chalcogenide material in the crystalline state may be less than the positive resistance exhibited by the chalcogenide material in the amorphous state below Vth. Thus, in some cases, a storage cell 205 within a memory cell 105, such as the storage cell 205-*a* of memory cell 105-*a*, may comprise a chalcogenide material, and the resistance of the storage cell 205 (and thus the state of the memory cell) may be sensed by applying a voltage within read region 335 (e.g., a voltage below Vth). A resistance corresponding to one of the amorphous or crystalline states may represent a logic "1" and a resistance corresponding to the other of the amorphous or crystalline states may represent a logic "0."

As shown by solid curve 305, the positive resistance exhibited by the chalcogenide material in the amorphous state following the snapback event may be significantly (e.g., detectably) lower than the positive resistance exhibited by the chalcogenide material prior to the snapback event. Thus, in some cases, a selector device 210 within a memory cell 105, such as the selector device 210-*a* of memory cell 105-*a*, may comprise a chalcogenide material that is formed or otherwise configured in an amorphous state and maintained in the amorphous state. Thus, very little current may flow through the memory cell 105 when a voltage across the memory cell 105 is below Vth, and significantly (e.g., detectably) more current may flow through the memory cell 105 when a voltage across the memory cell 105 exceeds Vth.

Thus, as illustrated in the example I-V curve of FIG. 3, the resistance of a material in an amorphous state (and thus of a memory cell 105 that comprises the material) may vary greatly depending on whether a voltage across the material is greater than or less than Vth (e.g., greater than or less than voltage 315). As explained in more detail below, a floating bit line 115 coupled with a memory cell 105 may be scanned with an electron beam so as to set the voltage across the memory cell to a surface voltage. Whether the surface voltage is greater than or less than Vth for the memory cell (e.g., greater than or less than voltage 315) may be determined based on whether scanning the floating bit line 115 causes current to flow through the memory cell 105 (e.g., puts the memory cell 105 into a relatively low-resistance state such as that illustrated by the portion of solid curve 305 above voltage 315) or does not cause current to flow through the memory cell 105 (e.g., the memory cell 105 remains in a relatively high-resistance state such as that illustrated by the portion of solid curve 305 below voltage 315). In some cases, the bit line 115 may be scanned repeatedly at progressively higher surface voltages until current is detected as flowing through the memory cell 105, with Vth determined as greater than the highest surface voltage that does not cause current to flow through the memory cell 105 and less than the lowest surface voltage that does cause current to flow through the memory cell 105.

Figure 4:
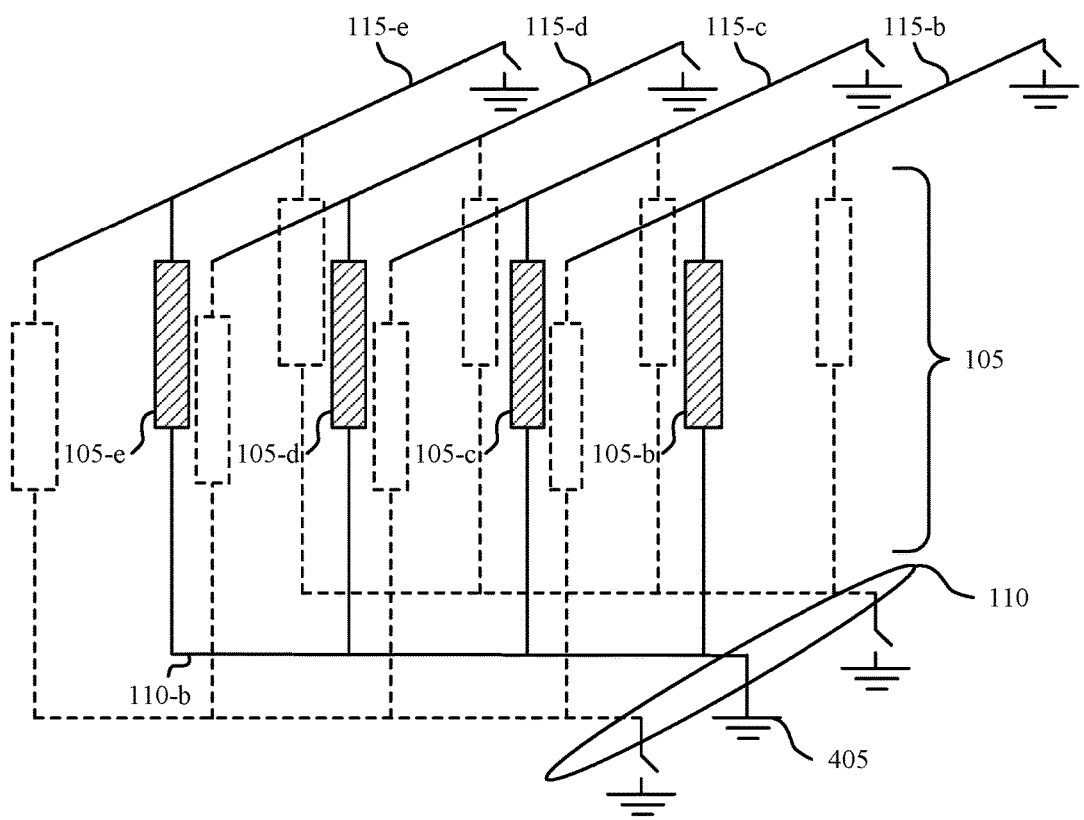
FIG. 4 illustrates an example of an apparatus that supports non-contact measurement of memory cell threshold voltage in accordance with embodiments of the present disclosure.

FIG. 4 illustrates an example of an apparatus 400 that supports non-contact measurement of memory cell threshold voltage in accordance with various embodiments of the present disclosure. Apparatus 400 includes a plurality of memory cells 105, a plurality of word lines 110, and a plurality of bit lines 115, which may be examples of memory cells 105, word lines 110, and bit lines 115, respectively, as described with reference to FIGS. 1 and 2.

Each memory cell 105 may be coupled with one corresponding word line 110 and one corresponding bit line 115. Thus, apparatus 400 may include one memory cell 105 for each unique word line 110/bit line 115 combination. In other examples, different configurations or combinations are contemplated.

In some cases, a memory cell 105 may be disposed at a cross point of the corresponding word line 110 and corresponding bit line 115. For example, the word lines 110 may be parallel to one another and oriented in a first direction, and the bit lines 115 may be parallel to one another and oriented in a second direction (e.g., a second direction that is orthogonal to the first direction). In some cases, the word lines 110 may be lower within the apparatus (e.g., at a lower level) than the bit lines 115, and memory cells 105 may be disposed between the level of the word lines 110 and the level of the bit lines 115.

In some cases, apparatus 400 may illustrate one deck of a device, and additional decks may be disposed above apparatus 400 within the device. For example, as further illustrated in and discussed with reference to FIG. 5, bit lines 115 may function as bit lines for the memory cells 105 illustrated in FIG. 4, but bit lines 115 may also function as word lines for additional memory cells 105 included in the deck immediately above apparatus 400. In some cases, such a multi-deck device may be an example of a three-dimensional cross-point (3DXP) device.

As shown in FIG. 4, one word line 110-b may be coupled to a ground reference 405 and may thus be a grounded word line 110-b. For example, the ground reference 405 may comprise or be coupled with a substrate of a wafer (e.g., a silicon wafer), which may also be referred to as a bulk of the wafer, that includes apparatus 400. The grounded word line 110-b may be directly coupled with the substrate (e.g., hardwired to the substrate through a low-resistance connection), or the grounded word line 110-b may be indirectly coupled with the substrate through a driver circuit. In some cases, the driver circuit may have any number of transistors, diodes, resistors or other electrical components configured to allow current to flow in at least one direction between the grounded word line 110-b and the substrate.

In some cases, apparatus 400 may include other word lines 110 as shown in FIG. 4—that is, word lines 110 other than the grounded word line 110-b—that are isolated from the ground reference 405. For example, apparatus 400 may include other word lines 110 that are floating (e.g., not driven to a defined voltage). For example, an access line may be floating if it is not coupled with a corresponding driver circuit or otherwise coupled with any voltage source or voltage reference, such as the ground reference 405.

The grounded word line 110-b may be coupled with one or more memory cells 105 (e.g., with shaded memory cells 105-b, 105-c, 105-d, 105-e in FIG. 4). A memory cell 105 coupled with the grounded word line 110-b may also be coupled with one corresponding bit line 115. For example, memory cell 105-b may be coupled with bit line 115-b, memory cell 105-c may be coupled with bit line 115-c, memory cell 105-d may be coupled with bit line 115-d, and memory cell 105-e may be coupled with bit line 115-e.

For each memory cell 105 coupled with the grounded word line 110-b, the corresponding bit line 115 may be isolated from the ground reference 405. For example, the corresponding bit line 115 may be floating. Thus, the corresponding bit line 115 may not be configured to be driven to a defined voltage by any circuitry within the apparatus 400 but may instead be configured to be set to a surface voltage by an electron beam, in accordance with the techniques described herein.

Further, each memory cell 105 coupled with the grounded word line 110-b may be configured to isolate the corresponding bit line 115 from the ground reference 405 when the voltage differential between the corresponding bit line 115 and the ground reference 405 is less than the Vth of the memory cell 105, and to couple the corresponding bit line 115 with the ground reference 405 (via grounded word line 110-b) when the voltage differential between the corresponding bit line 115 and the ground reference 405 is greater than the Vth of the memory cell 105. That is:

memory cell 105-b may be configured to isolate bit line 115-b from the ground reference 405 when the voltage differential between bit line 115-b and the ground reference 405 is less than the Vth of memory cell 105-b, and to couple the bit line 115-b with the ground reference 405 (via grounded word line 110-b) when the voltage differential between bit line 115-b and the ground reference 405 is greater than the Vth of memory cell 105-b;

memory cell 105-c may be configured to isolate bit line 115-c from the ground reference 405 when the voltage differential between bit line 115-c and the ground reference 405 is less than the Vth of memory cell 105-c, and to couple the bit line 115-c with the ground reference 405 (via grounded word line 110-b) when the voltage differential between bit line 115-c and the ground reference 405 is greater than the Vth of memory cell 105-c;

memory cell 105-d may be configured to isolate bit line 115-d from the ground reference 405 when the voltage differential between bit line 115-d and the ground reference 405 is less than the Vth of memory cell 105-d, and to couple the bit line 115-d with the ground reference 405 (via grounded word line 110-b) when the voltage differential between bit line 115-d and the ground reference 405 is greater than the Vth of memory cell 105-d; and memory cell 105-e may be configured to isolate bit line 115-e from the ground reference 405 when the voltage differential between bit line 115-e and the ground reference 405 is less than the Vth of memory cell 105-e, and to couple the bit line 115-e with the ground reference 405 (via grounded word line 110-b) when the voltage differential between bit line 115-e and the ground reference 405 is greater than the Vth of memory cell 105-e.

It should be understood that apparatus 400 may include any number of memory cells 105 coupled with the grounded word line 110-b and any number of corresponding bit lines 115. It should also be understood that any one of the word lines 110 may be coupled with the ground reference 405, so long as any other word lines 110 within the apparatus 400 are floating, and Vth for the memory cells 105 coupled with that one word line 110 may thus be determined in accordance with the techniques described herein.

It should also be understood that physical arrangement of the word lines, memory cells 105, and bit lines 115 in apparatus 400 is an illustrative example only, and that memory cells 105 and bit lines 115 may be otherwise arranged in accordance with the techniques described herein such that, for each memory cell 105 for which determination of Vth may be desired, a single current path from the ground reference 405 to the corresponding bit line 115 exists and is through the memory cell 105. For example, in some cases, word lines 110 other than the grounded word line 110-*b* may not be present.

In some cases, apparatus 400 may be included in (e.g., fabricated on) a die that includes other memory cells 105 in addition to those for which determination of Vth is desired. For example, apparatus 400 may represent a test structure within the die, and other memory cells 105 may be included in the die that are not part of the test structure. In some cases, a single wafer may include a plurality of memory tiles, and apparatus 400 may be included in one of the memory tiles while on or more other memory tiles of the wafer include other devices or memory structures.

In some cases, a default configuration for memory cells 105 within a die that includes apparatus 400 may include coupling each memory cell 105 with a corresponding word line 110 and a corresponding bit line 115, and coupling each access line (e.g., word line 110 or bit line 115) with a corresponding driver circuit that may drive the access line to the ground reference 405 or some other configurable voltage. Thus, in some cases, grounded word line 110-*b* may be coupled with a corresponding driver circuit, and may be coupled with the ground reference 405 through the corresponding driver circuit. For example, the corresponding driver circuit may be configured to allow current to flow between the ground reference 405 and the grounded wordline 110-*b* either bi-directionally or unidirectionally (e.g., from the grounded word-line 110-*b* to the ground reference 405). Configuring the corresponding driver circuit to allow current to flow between the ground reference 405 and the grounded word-line 110-*b* may comprising forming the corresponding driver circuit in such a configuration, so as to facilitate determination of Vth for one or more memory cells 105 during fabrication of a wafer.

In some cases, however, grounded word line 110-*b* may be coupled directly with the ground reference 405. For example, grounded word line 110-*b* may be "hardwired" to the ground reference 405 with conductive materials and thus with no intervening active (e.g., switching) circuitry that may decouple the grounded word line 110-*b* and the ground reference 405 and no intervening resistive element (e.g., an element with a non-negligible resistance). In some cases, for example, one or more interconnect layers within the die may be configured (e.g., modified from a default configuration) so as to couple the grounded word line 110-*b* directly (e.g., in hardwired fashion) to the die substrate.

In some cases, a floating access line within apparatus 400 (e.g., any bit line 115 and any word line 110 other than the grounded word line 110-*b* within apparatus 400) may be isolated from the ground reference 405 by configuring (e.g., modifying from a default configuration) one or more interconnect layers within the die so as to include one or more gaps that isolate the floating access line from a corresponding driver circuit. A die that includes apparatus 400 may include other access lines (e.g., bit lines 115 or word lines 110 corresponding to memory cells 105 for which determination of Vth is not desired) that remain coupled to corresponding driver circuits (e.g., via one or more interconnect layers). Such other bit lines 115 may be at a same level of the die as the bit lines 115 within apparatus 400, and such other word lines 110 may be at a same level of the die as the word lines 110 within apparatus 400.

Figure 5:
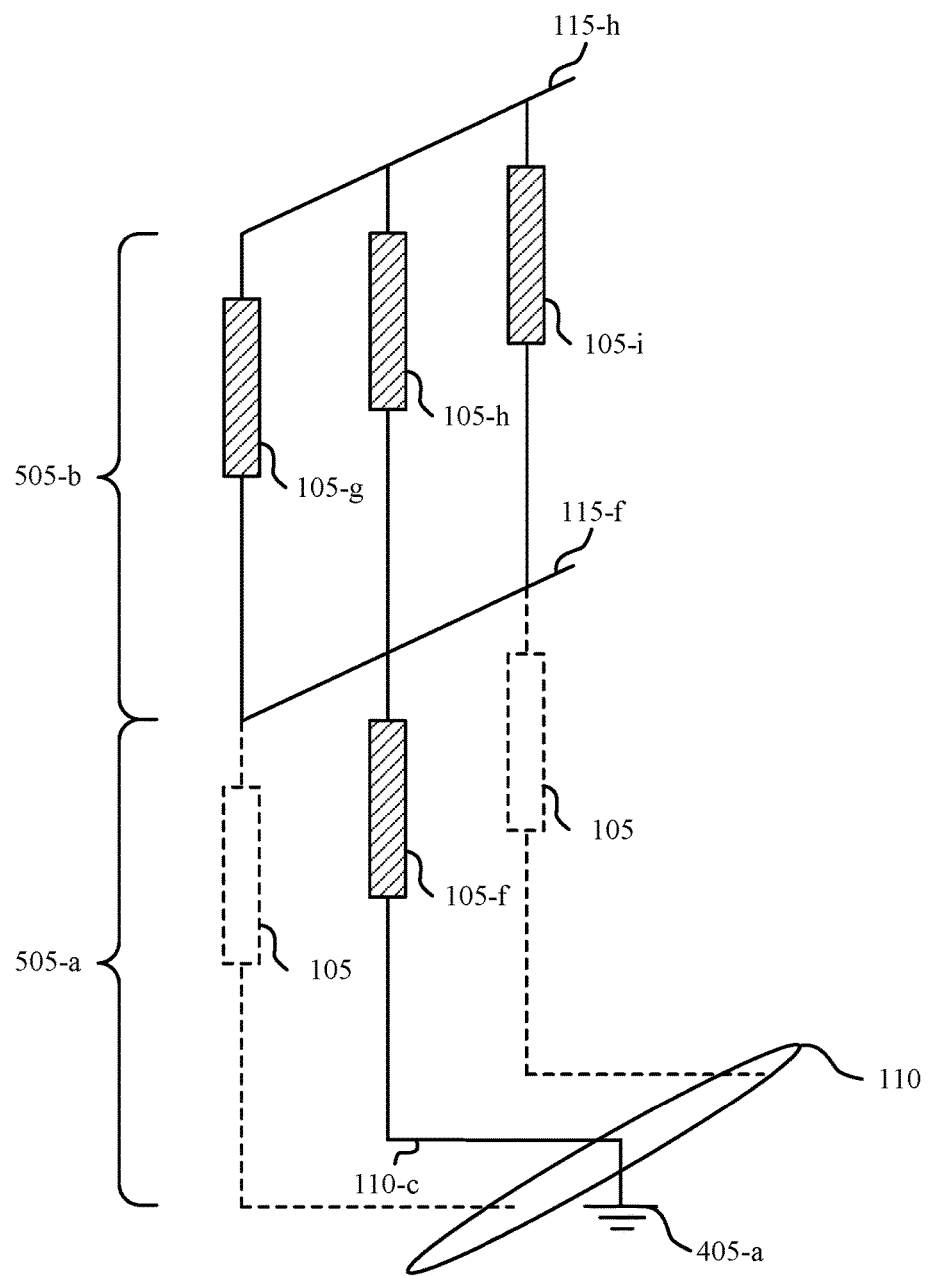
FIG. 5 illustrates an example of an apparatus that supports non-contact measurement of memory cell threshold voltage in accordance with embodiments of the present disclosure.

FIG. 5 illustrates an example of an apparatus 500 that supports non-contact measurement of memory cell threshold voltage in accordance with various embodiments of the present disclosure. Apparatus 500 includes a plurality of memory cells 105, a plurality of word lines 110, and a plurality of bit lines 115, which may be examples of memory cells 105, word lines 110, and bit lines 115, respectively, as described with reference to FIGS. 1, 2, and 4.

Apparatus 500 may include a first deck 505-*a* and a second deck 505-*b*. The first deck 505-*a* may include one word line 110-*c* coupled with a ground reference 405-*a*, which may thus be referred to as a grounded word line 110-*c*. The first deck 505-*a* may also include a memory cell 105-*f* that is coupled with the grounded word line 110-*c* and with a corresponding bit line 115-*f*. As shown in FIG. 5, the first deck 505-*a* may also include other word lines 110—that is, word lines 110 other than the grounded word line 110-*c*— that are isolated from the ground reference 405-*a*, and other memory cells 105—that is, memory cells 105 other than memory cell 105-*f*—that are coupled with a corresponding other word line 110.

The second deck 505-*b* may be above the first deck 505-*a* include a second plurality of memory cells 105 (e.g., shaded memory cells 105-*g*, 105-*g*, and 105-*i*) coupled with the bit line 115-*f*. The bit line 115-*f* may also serve as a word line for the second plurality of memory cells 105. The second plurality of memory cells 105 may also each be coupled with a second corresponding access line, such as a bit line 115-*h*. Both the bit line 115-*f* and the bit line 115-*h* may be isolated from the ground reference 405-*a* and floating.

The memory cell memory cell 105-*f* may be configured to isolate bit line 115-*f* from the ground reference 405-*a* when the voltage differential between bit line 115-*f* and the ground reference 405-*a* is less than the Vth of memory cell 105-*f*, and to couple the bit line 115-*f* with the ground reference 405-*a* (via grounded word line 110-*b*) when the voltage differential between bit line 115-*f* and the ground reference 405-*a* is greater than the Vth of memory cell 105-*f*. Further, each memory cell 105 coupled with bit line 115-*h* and bit line 115-*f* may be configured to isolate bit line 115-*h* from bit line 115-*f* when the voltage differential between bit line 115-*h* and bit line 115-*f* is less than the Vth of the memory cell 105, and to couple bit line 115-*h* with bit line 115-*f* when the voltage differential between bit line 115-*h* and bit line 115-*f* is greater than the Vth of the memory cell 105.

Hence, if bit line 115-*h* is set to a voltage (e.g., set to a surface voltage by an electron beam) sufficiently high so as to cause the voltage differential between bit line 115-*h* and the ground reference to exceed the Vth of memory cell 105-*f* and the Vth of at least one of the second plurality of memory cells 105 (e.g., at least one of shaded memory cells 105-*g*, 105-*g*, and 105-*i*), then memory cell 105-*f* and at least one of the second plurality of memory cells 105 may couple bit line 115-*h* with the ground reference.

It should be understood that each deck 505 of apparatus 500 may include any number of bit lines 115 and corresponding memory cells 105, and that an apparatus in accordance with the structures and techniques described herein may comprise any number of decks 505.

Figure 6:
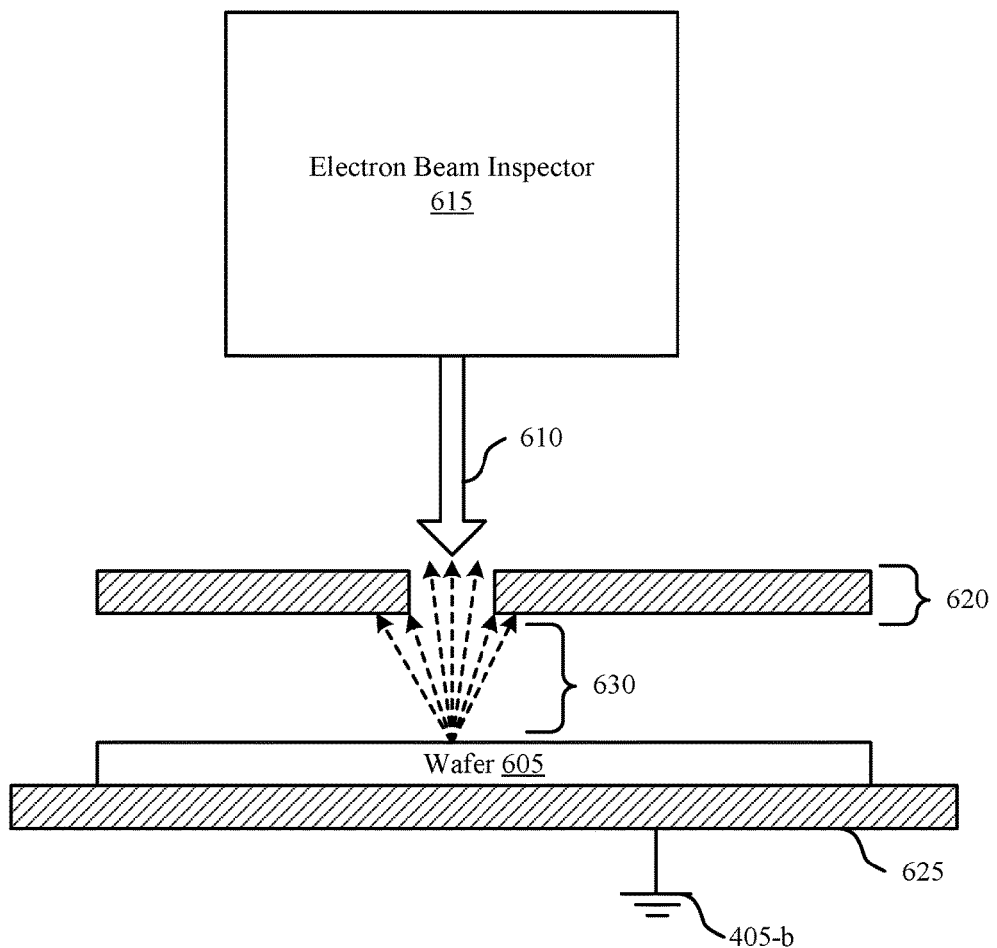
FIG. 6 illustrates an example of a process that supports non-contact measurement of memory cell threshold voltage in accordance with embodiments of the present disclosure.

FIG. 6 illustrates a side view of an example process 600 that supports non-contact measurement of memory cell threshold voltage in accordance with various embodiments of the present disclosure. Process 600 may include scanning a wafer 605 (e.g., a silicon wafer)—which may include an apparatus such as apparatus 400, apparatus 500, or another apparatus in accordance with the teachings herein—with an electron beam 610.

The electron beam 610 may be generated by an EBI 615. The EBI 615 may in some cases be an Hermes Micro Vision EBI. The EBI 615 may include a Wehnelt electrode 620 and a stage 625. The stage 625 may be coupled with or may otherwise serve as a ground reference 405-b. The Wehnelt electrode 620 may create a positive or negative voltage potential relative to the stage 625, and thus may either attract or repel scattered electrons 630 that may be extracted from the wafer 605. The EBI 615 may have image analysis capabilities and may in some cases support voltage contrasting techniques.

The wafer 605 may be configured such that one or more bit lines 115 may be scanned by the electron beam 610 (e.g., may be exposed at the upper surface of the wafer 605). The wafer 605 may also be configured so that a substrate of the wafer 605 is in contact with the stage 625 or otherwise coupled with the ground reference 405-b.

In some cases, process 600 may occur when the wafer 605 is at an intermediate stage of fabrication. For example, process 600 may occur during a fabrication step at which one or more decks 505 of memory cells 105 and bit lines 115 have been fabricated and after which one or more additional fabrication steps may occur (e.g., one or more additional decks 505 of memory cells 105 and bit lines 115 may be fabricated, or one or more other layers may be formed on the wafer 605).

In some cases, the difference in voltage potential between the electron source within EBI 615 (the source of the electron beam 610) and the stage 625 may dictate the landing energy of electrons within the electron beam 610 upon the surface of the wafer 605. The electron beam 610 may generate a number scattered electrons 630 at a scanned location (e.g., localized spot) on the surface of the wafer 605, which may include back scattered electrons and secondary electrons, based upon the landing energy of electrons within the electron beam 610 (and thus upon the difference in voltage potential between the electron source within EBI 615 and the stage 625) and the characteristics of the scanned surface material of the wafer 605. For example, difference surface materials may have different electron yield (a) characteristics (e.g., extracted electron count/incident electron count) at different levels of landing energy (e.g., as measured in electronvolts (eV)) for the electron beam 610.

If the Wehnelt electrode 620 is configured to have a positive voltage potential relative to the stage 625 (and thus to the ground reference 405-b), then the Wehnelt electrode 620 may attract the scattered electrons 630. Thus, if the landing energy of the electron beam 610 is sufficient to have an electron yield greater than 1 ($\sigma$>1), and the Wehnelt electrode 620 is configured to have a positive voltage, then the EBI 615 may act in an extraction mode, as more electrons (e.g., scattered electrons 630) may be extracted from the wafer 605 than are inserted into the wafer 605 by the electron beam 610. This net loss of electrons at the scanned location of the surface of the wafer 605 may result in a positive voltage at the scanned location of the surface of the wafer 605 relative to the stage 625 and the ground reference.

Thus, in some cases, current may flow from a scanned location on the surface of the wafer 605 to the ground reference 405-b so long as a conductive path exists between the scanned location on the surface of the wafer 605 and the ground reference 405-b. (e.g., between a bit line 115 at the surface of the wafer 605 and the ground reference 405-b). If a conductive path does not exist between the scanned location on the surface of the wafer 605 and the ground reference 405-b, then and the scanned location on the surface of the wafer 605 may not emit scattered electrons 630

Conversely, if the Wehnelt electrode 620 is configured to have a negative voltage potential relative to the stage 625 (and thus to the ground reference 405-b), then the Wehnelt electrode 620 may repel the scattered electrons 630 back to the wafer 605. Thus, the electrons inserted into the wafer 605 by the electron beam 610 may cause a net gain of electrons at the scanned location of the surface of the wafer 605, resulting in a negative voltage at the scanned location of the surface of the wafer 605 relative to the stage 625 and the ground reference. Thus, in some cases, current may flow from the ground reference 405-b to the scanned location on the surface of the wafer 605 so long as a conductive path exists between the scanned location on the surface of the wafer 605 and the ground reference 405-b. (e.g., between a bit line 115 at the surface of the wafer 605 and the ground reference 405-b).

In some cases, EBI 615 may include a beam deflector, and the beam deflector may be configured to direct the electron beam 610 to be incident upon a particular location on the surface of the wafer 605. In some cases, the beam deflector may be configured to direct the electron beam 610 to be incident upon a particular location on the surface of the wafer 605 for a particular amount of time, which may be referred to as a dwelling time.

As explained in more detail with reference to FIG. 7, wafer 605 may include apparatus 400, apparatus 500, or another structure in accordance with the teachings herein. The electron beam 610 may be targeted to specific locations on the top surface of the wafer 605 (either by directing the electron beam 610 or by positioning (e.g., moving) the wafer 605) corresponding to exposed floating bit lines 115. The surface voltage at a scanned location on the surface of the wafer 605 may be configured by configuring the landing energy of the electron beam 610 (that is, by configuring EBI 615 to generate the electron beam 610 so as to have a desired landing energy) or, alternatively or additionally, by configuring the voltage of the Wehnelt electrode 620 relative to the stage 625. Voltage contrasting or other techniques, such as other image analysis techniques, may be used to determine whether scanning a floating bit line 115 causes current to flow between the scanned bit line 115 and the ground reference 405-b, with current flowing between the scanned bit line 115 and the ground reference 405-b indicative that the surface voltage created by the electron beam exceeds Vth for the memory cell 105 corresponding to the scanned bit line 115.

Figure 7:
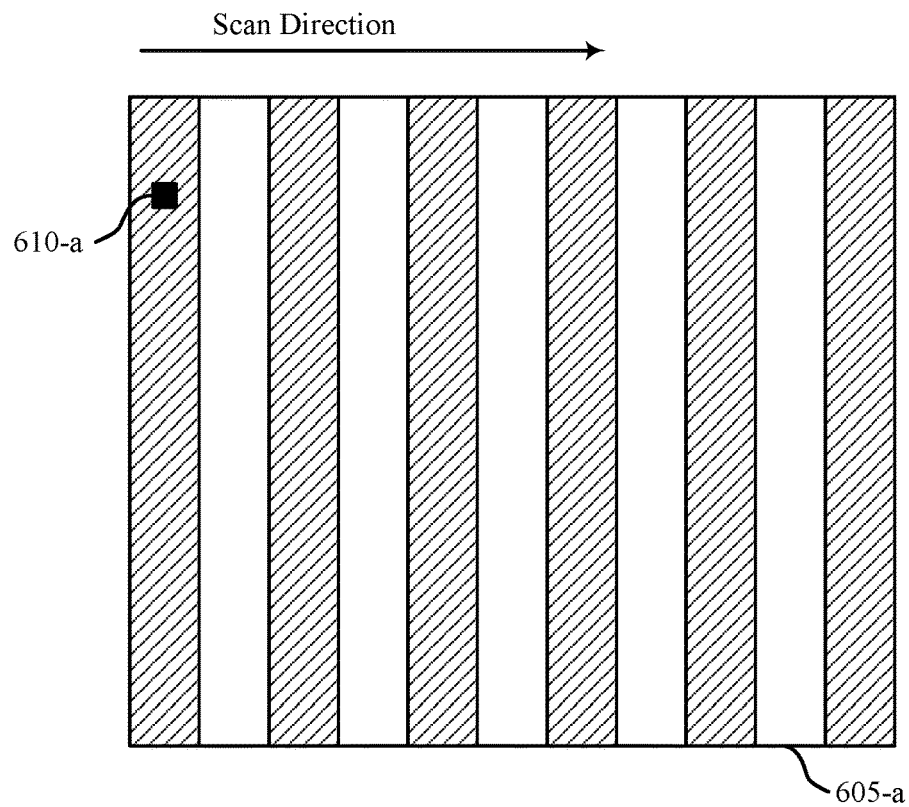
FIG. 7 illustrates an example of a process that supports non-contact measurement of memory cell threshold voltage in accordance with embodiments of the present disclosure.
Figure 7:
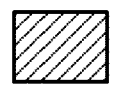
Figure 7:

FIG. 7 illustrates a top view of an example process 700 that supports non-contact measurement of memory cell threshold voltage in accordance with various embodiments of the present disclosure. Process 700 may include scanning a wafer 605-a (e.g., a silicon wafer)—which may include an apparatus such as apparatus 400, apparatus 500, or another apparatus in accordance with the teachings herein—with an electron beam 610-a. In some cases, the wafer 605-a illustrated in FIG. 7 may be a wafer portion and may be part of a larger wafer that includes other structures.

The wafer 605-a may include a number of exposed (e.g., exposed to the top surface of the wafer 605-a) bit lines 115. The bit lines 115 may be included in an apparatus such as apparatus 400, apparatus 500, or another apparatus in accordance with the teachings herein. In some cases, the bit lines 115 may comprise tungsten, and just the exposed surface material for bit lines 115 may be a tungsten material. From a top view, the surface of the wafer 605-*a* may alternate between bit lines 115 and other material 705. The other material may comprise one or more dielectric, insulating, or other materials.

The electron beam 610-*a* may have an associated width or diameter (e.g., 5 nanometers), and each bit line 115 may have an associated width (e.g., 20 nanometers). Each bit line 115 may or may not have the same width.

As indicated by FIG. 7, process 700 may include scanning the bit lines 115 in a particular direction and/or for a particular duration with the electron beam 610-*a*. The electron beam 610-*a* may be configured to scan each bit line 115 for a particular dwelling time, with a particular landing energy, and with a particular Wehnelt electrode 620 voltage. Thus, the surface voltage of a bit line 115, when scanned, may be determined by a configuration of an EBI 615 that generates the electron beam 610-*a* and/or the configuration of a Wehnelt electrode 620, as described in reference to FIG. 6.

The EBI 615 that generates the electron beam 610-*a* may include one or more voltage imaging contrasting and related capabilities. Thus, image analysis may be used to determine whether a voltage difference between a surface voltage of a scanned bit line 115, as set by scanning the bit line 115 with the electron beam 610-*a*, and a ground reference 405 is sufficient to cause current to flow between the scanned bit line 115 and the ground reference 405. For example, the EBI 615 may produce an image in which a bit line 115 that is coupled with the ground reference 405 appears as having a first brightness (e.g., as a relatively bright line in an EBI image), and a bit line 115 that is not coupled with the ground reference 405 appears as having a second brightness lower than the first brightness (e.g., as a relatively dark line in an EBI image). For example, a bit line 115 that is coupled with the ground reference 405 may appear as a relatively bright line because a current path exists between the ground reference 405 and the bit line 115 such that the bit line 115 may emit scattered electrons 630. Conversely, for example, a bit line 115 that is not coupled with the ground reference 405 may appear as a relatively dark line because no current path exists between the ground reference 405 and the bit line 115 such that the bit line 115 may not emit scattered electrons 630.

Thus, the EBI 615 may produce an image in which, if the surface voltage of the scanned bit line 115 exceeds Vth for a corresponding memory cell 105 (relative to the ground reference 405), the bit line may appear as having a first brightness (e.g., as a relatively bright line). Similarly, if the surface voltage of the scanned bit line 115 is below Vth for the corresponding memory cell 105 (relative to the ground reference 405), the bit line may appear as having a second brightness lower than the first brightness (e.g., as a relatively dark line). Thus, based at least in part on scanning a bit line 115 with the electron beam 610-*a* and thereby setting the bit line 115 to a surface voltage, Vth for a memory cell 105 corresponding to (e.g., coupled with) the bit line 115 may be determined.

By repeatedly scanning a bit line 115 of the wafer 605-*a* with the electron beam 610-*a* with progressively increasing surface voltages, Vth for a corresponding memory cell 105 may be determined. For example, Vth for the corresponding memory cell 105 may be determined as greater than a highest surface voltage that does not result in a line having a first brightness (e.g., a relatively bright line) and less than or equal to a lowest surface voltage that does result in a line having the first brightness. The accuracy of such Vth determinations may improve commensurate with granularity of control for EBIs and/or Wehnelt electrodes and related image analysis capabilities.

Further, multiple bit lines 115 of the wafer 605-*a* may be scanned with the electron beam 610-*a*, possibly repeatedly with progressively increasing surface voltages, to get a distribution of Vth values for different memory cells 105 corresponding to the different bit lines 115. Thus, information about process variation may be obtained based at least in part on scanning the bit lines 115 with the electron beam 610-*a* as well as information about absolute Vth values. For example, with successive scans by the electron beam 610-*a* with different surface voltage configurations, a density of conductive memory cells 105 versus nonconductive memory cells 105 may be quantified for each surface voltage configuration.

For example, wafer 605 may include apparatus 400, apparatus 500, or another structure in accordance with the teachings herein. Considering the example of apparatus 400, the electron beam 610-*a* and/or the Wehnelt electrode 620 may be configured to generate a first surface voltage, and the electron beam 610-*a* may be directed so as to be incident upon floating bit line 115-*b* (either by directing the electron beam 610-*a* or by positioning (e.g., moving) the wafer 605), and voltage contrasting may be used to determine whether floating bit line 115-*b* becomes coupled with the ground reference 405 and thus whether the first surface voltage exceeds Vth for memory cell 105-*b*. The electron beam 610-*a* may subsequently be directed so as to successively be incident upon floating bit line 115-*c*, floating bit line 115-*d*, and floating bit line 115-*e*, and voltage contrasting may similarly be used to determine whether the first surface voltage exceeds Vth for memory cell 105-*c*, memory cell 105-*d*, and memory cell 105-*e* respectively.

Subsequently, the electron beam 610-*a* and/or the Wehnelt electrode 620 may be configured to generate a second, higher surface voltage, and the electron beam 610-*a* may be directed so as to successively be incident upon floating bit line 115-*b*, floating bit line 115-*c*, floating bit line 115-*d*, and floating bit line 115-*e*, and voltage contrasting may similarly be used to determine whether the second surface voltage exceeds Vth for memory cell 105-*b*, memory cell 105-*c*, memory cell 105-*d*, and memory cell 105-*e* respectively. It is so be understood that any number of different surface voltages may be utilized, that different surface voltages may be utilized in any order (e.g., either increasing, decreasing, or neither increasing no decreasing order), that any number of floating bit lines 115 may be scanned, and that floating bit lines 115 may be scanned in any temporal order.

Thus, the structures and techniques described herein may allow Vth for one or more memory cells to be measured without contacting the memory cells or corresponding access lines (e.g., physically contacting the memory cells or corresponding access lines with a physical probe). Accordingly, the structures and techniques described herein may be utilized without forming or using specialized contact structures for physical probes, such as bond pads. The structures and techniques described herein may also, for example, allow Vth for one or more memory cells to be measured at an intermediate fabrication step for a wafer (e.g., a fabrication step at which the one or more corresponding bit lines are exposed at an upper surface of a wafer or die), thereby providing information for engineers and other personnel with reduced latency.

Further, by facilitating Vth measurement at an intermediate fabrication step, the structures and techniques described herein may facilitate Vth measurement at multiple steps within a fabrication process (e.g., at a first step when bit lines 115 for a first deck 505 are exposed at the top surface of a wafer 605, at a second step when bit lines 115 for a second deck 505 are exposed at the tope surface of the wafer 605, and so on). The structures and techniques described herein may also be suitable for device structures that are problematic (e.g., structures that are too small, too rough, have too many layers, or have layers with interfering characteristics) for one or more other Vth measurement techniques, such as contact-based Vth measurement techniques utilizing physical probes. Thus, the structures and techniques described herein may have benefits such as increasing reliability of memory structures, detecting excursions from multiple processing steps, reducing design or manufacturing costs of memory structures, or reducing design or manufacturing time of memory structures (e.g., expediting learning cycles), along with other benefits that may be appreciated by one of ordinary skill.

Figure 8:
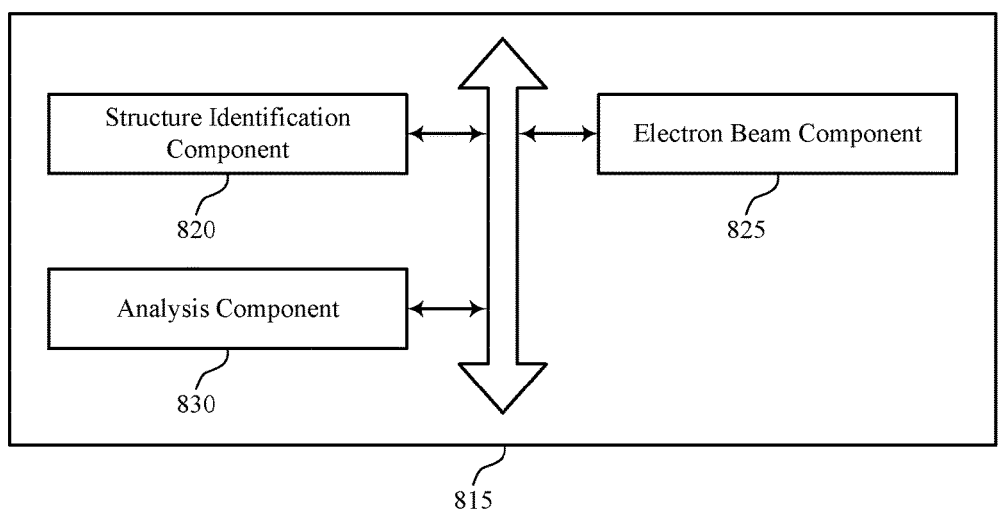
FIG. 8 illustrates a block diagram of a device that supports non-contact measurement of memory cell threshold voltage in accordance with embodiments of the present disclosure.

FIG. 8 shows a block diagram 800 of a testing manager 815 that supports non-contact measurement of memory cell threshold voltage in accordance with embodiments of the present disclosure. The testing manager 815 may be an example of aspects of a testing manager 915 described with reference to FIG. 9. The testing manager 815 may include structure identification component 820, electron beam component 825, and analysis component 830. Each of these modules may communicate, directly or indirectly, with one another (e.g., via one or more buses).

Structure identification component 820 may identify a first access line that is coupled with a ground reference and identify a set of memory cells each coupled with the first access line and with a corresponding second access line of a set of second access lines.

Electron beam component 825 may set at least one second access line of the set of second access lines to a surface voltage by scanning the at least one second access line with an electron beam and set the at least one second access line of the set of second access lines to a second surface voltage by scanning the at least one second access line with a second electron beam.

Analysis component 830 may determine a threshold voltage of a corresponding memory cell of the set of memory cells based on setting the at least one second access line of the set of second access lines to the surface voltage. In some cases, analysis component 830 may also determine, based on scanning the at least one second access line with the electron beam, that the at least one second access line is coupled with the first access line, where determining the threshold voltage of the corresponding memory cell is based on determining that the at least one second access line is coupled with the first access line. Analysis component 830 may also determine the threshold voltage of the corresponding memory cell of the set of memory cells based on setting the at least one second access line of the set of second access lines to the second surface voltage.

Figure 9:
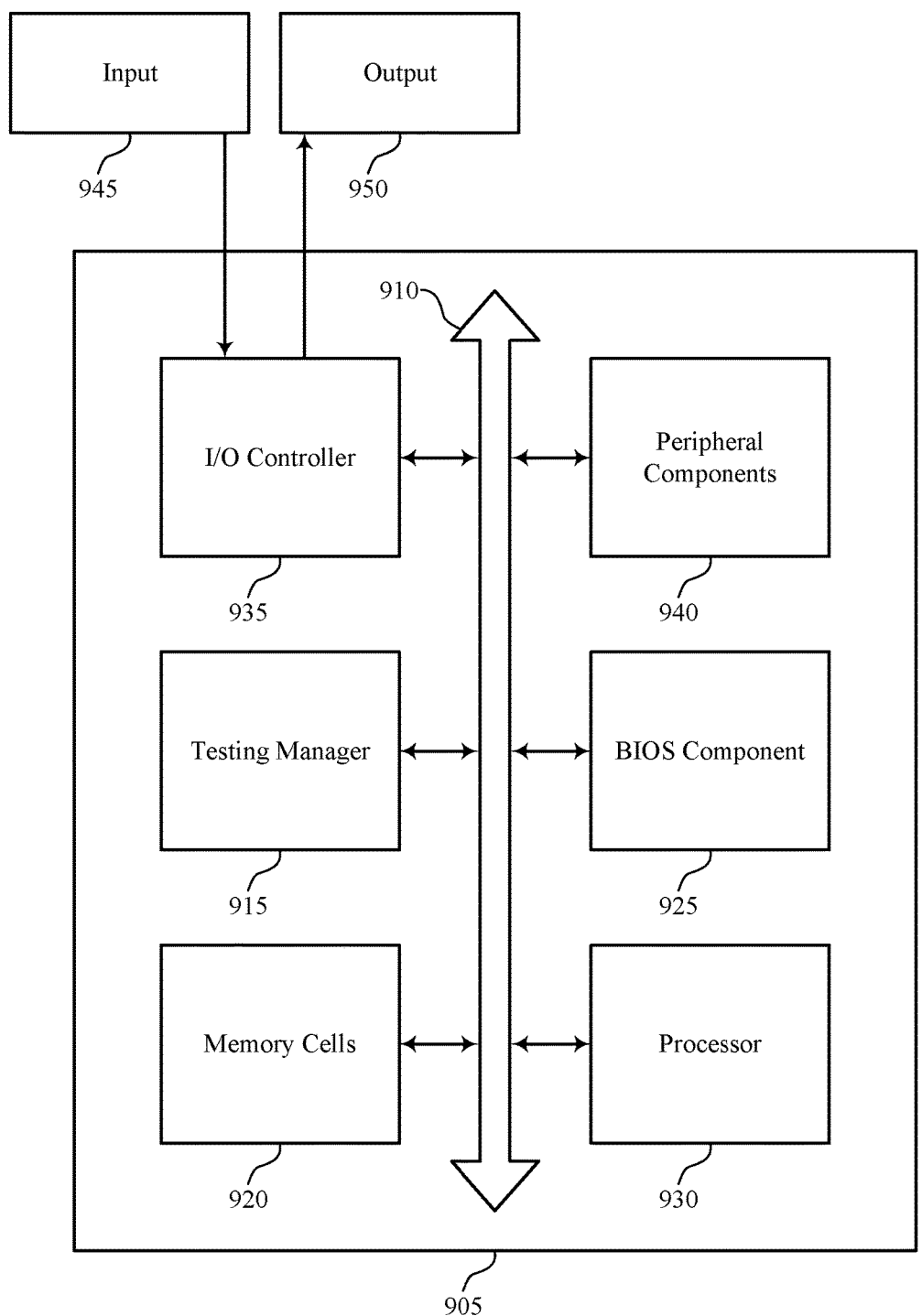
FIG. 9 illustrates a block diagram of a system including a testing manager that supports non-contact measurement of memory cell threshold voltage in accordance with embodiments of the present disclosure.

FIG. 9 shows a diagram of a system 900 including a device 905 that supports non-contact measurement of memory cell threshold voltage in accordance with embodiments of the present disclosure. Device 905 may be an example of or include the components of testing manager 815 as described above, e.g., with reference to FIG. 8. Device 905 may include components for bi-directional voice and data communications including components for transmitting and receiving communications, including testing manager 915, memory cells 920, basic input/output system (BIOS) component 925, processor 930, I/O controller 935, and peripheral components 940. These components may be in electronic communication via one or more buses (e.g., bus 910).

Memory cells 920 may store information (i.e., in the form of a logical state) as described herein.

BIOS component 925 be a software component that includes BIOS operated as firmware, which may initialize and run various hardware components. BIOS component 925 may also manage data flow between a processor and various other components, e.g., peripheral components, input/output control component, etc. BIOS component 925 may include a program or software stored in read only memory (ROM), flash memory, or any other non-volatile memory.

Processor 930 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 930 may be configured to operate a memory array using a memory controller. In other cases, a memory controller may be integrated into processor 930. Processor 930 may be configured to execute computer-readable instructions stored in a memory to perform various functions (e.g., functions or tasks supporting non-contact measurement of memory cell threshold voltage).

I/O controller 935 may manage input and output signals for device 905. I/O controller 935 may also manage peripherals not integrated into device 905. In some cases, I/O controller 935 may represent a physical connection or port to an external peripheral. In some cases, I/O controller 935 may utilize an operating system such as iOS®, ANDROID®, MS-DOS®, MS-WINDOWS®, OS/2®, UNIX®, LINUX®, or another known operating system. In other cases, I/O controller 935 may represent or interact with a modem, a keyboard, a mouse, a touchscreen, or a similar device. In some cases, I/O controller 935 may be implemented as part of a processor. In some cases, a user may interact with device 905 via I/O controller 935 or via hardware components controlled by I/O controller 935.

Peripheral components 940 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 945 may represent a device or signal external to device 905 that provides input to device 905 or its components. This may include a user interface or an interface with or between other devices. In some cases, input 945 may be managed by I/O controller 935, and may interact with device 905 via a peripheral component 940.

Output 950 may also represent a device or signal external to device 905 configured to receive output from device 905 or any of its components. Examples of output 950 may include a display, audio speakers, a printing device, another processor or printed circuit board, etc. In some cases, output 950 may be a peripheral element that interfaces with device 905 via peripheral component(s) 940. In some cases, output 950 may be managed by I/O controller 935

The components of device 905 may include circuitry designed to carry out their functions. This may include various circuit elements, for example, conductive lines, transistors, capacitors, inductors, resistors, amplifiers, or other active or inactive elements, configured to carry out the functions described herein. Device 905 may be a computer, a server, a laptop computer, a notebook computer, a tablet computer, a mobile phone, a wearable electronic device, a personal electronic device, or the like. Or device 905 may be a portion or aspect of such a device.

Figure 10:
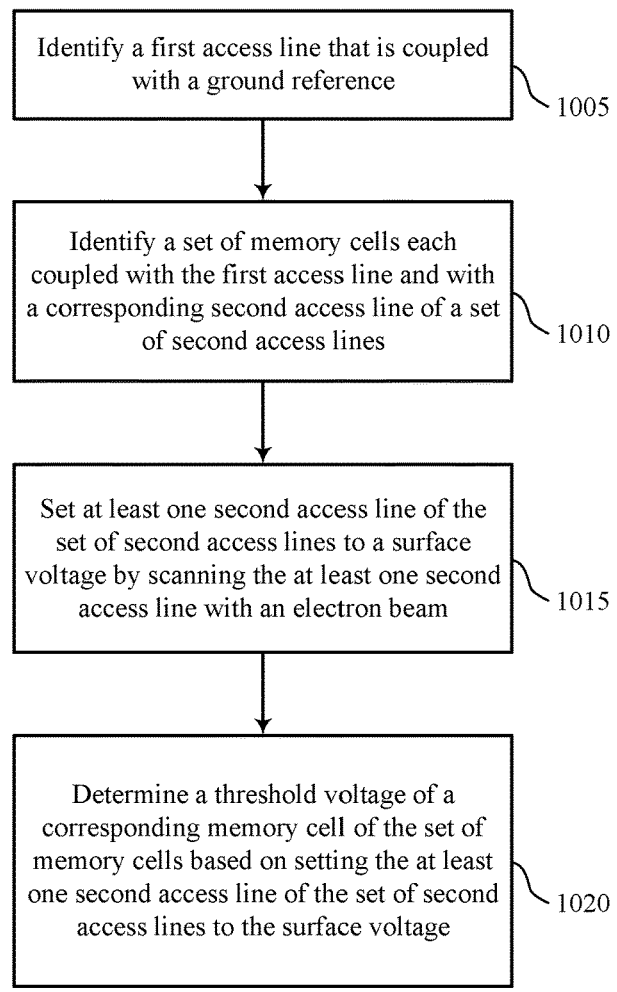
FIGS. 10-12 illustrate methods for non-contact measurement of memory cell threshold voltage in accordance with embodiments of the present disclosure.

FIG. 10 shows a flowchart illustrating a method 1000 for non-contact measurement of memory cell threshold voltage in accordance with embodiments of the present disclosure. The operations of method 1000 may be implemented by a testing manager 815 or its components as described herein. For example, the operations of method 1000 may be performed by a testing manager as described with reference to FIGS. 8 and 9. In some examples, a testing manager 815 may execute a set of codes to control the functional elements of one or more devices to perform the functions described below. Additionally or alternatively, the testing manager 815 may perform aspects of the functions described below using special-purpose hardware.

At 1005 the testing manager 815 may identify a first access line that is coupled with a ground reference. The first access line may be included in an apparatus that supports non-contact measurement of memory cell threshold voltage in accordance with embodiments of the present disclosure, such as the example of apparatus 400 or the example of apparatus 500. The operations of 1005 may be performed according to the methods described herein. In certain examples, aspects of the operations of 1005 may be performed by a structure identification component as described with reference to FIGS. 8 and 9.

At 1010 the testing manager 815 may identify a plurality of memory cells each coupled with the first access line and with a corresponding second access line of a plurality of second access lines. The operations of 1010 may be performed according to the methods described herein. In certain examples, aspects of the operations of 1010 may be performed by a structure identification component as described with reference to FIGS. 8 and 9.

At 1015 the testing manager 815 may set at least one second access line of the plurality of second access lines to a surface voltage by scanning the at least one second access line with an electron beam. The operations of 1015 may be performed according to the methods described herein. In certain examples, aspects of the operations of 1015 may be performed by an electron beam component as described with reference to FIGS. 8 and 9.

At 1020 the testing manager 815 may determine a threshold voltage of a corresponding memory cell of the plurality of memory cells based at least in part on setting the at least one second access line of the plurality of second access lines to the surface voltage. The operations of 1020 may be performed according to the methods described herein. In certain examples, aspects of the operations of 1020 may be performed by an analysis component as described with reference to FIGS. 8 and 9.

Figure 11:
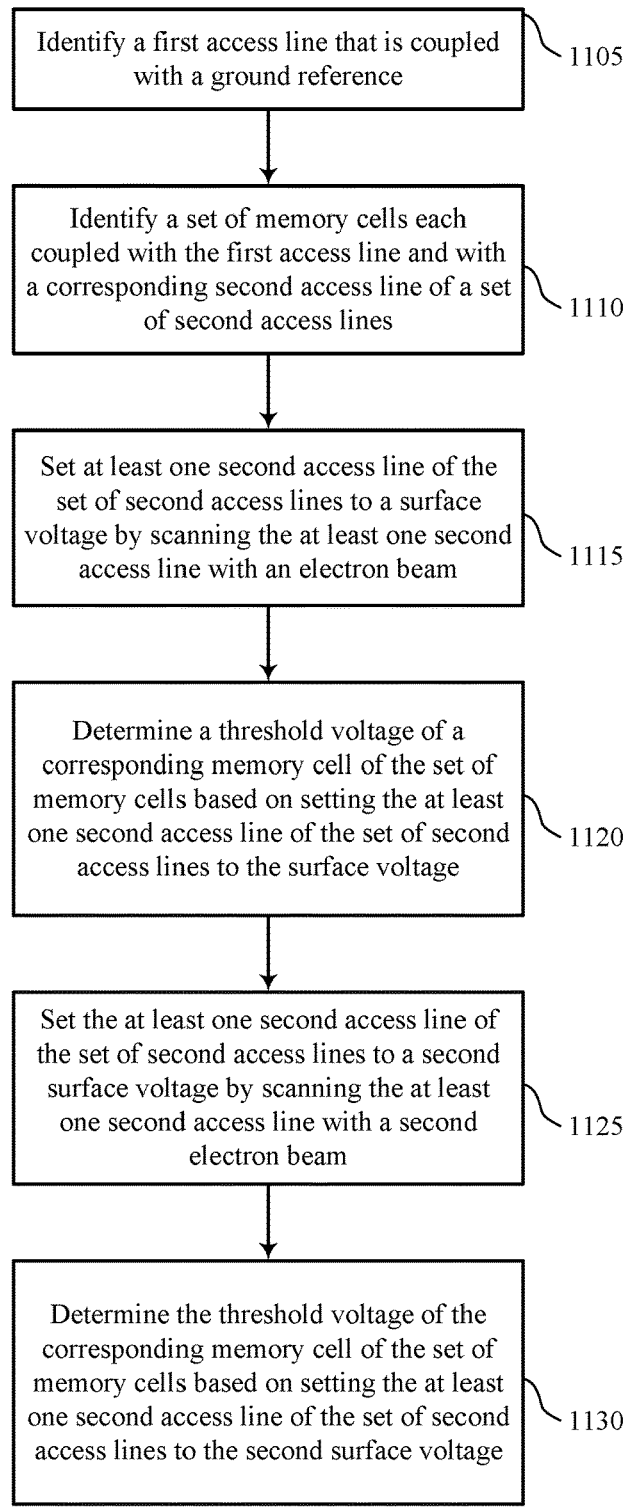

FIG. 11 shows a flowchart illustrating a method 1100 for non-contact measurement of memory cell threshold voltage in accordance with embodiments of the present disclosure. The operations of method 1100 may be implemented by a testing manager 815 or its components as described herein. For example, the operations of method 1100 may be performed by a testing manager as described with reference to FIGS. 8 and 9. In some examples, a testing manager 815 may execute a set of codes to control the functional elements of one or more devices to perform the functions described below. Additionally or alternatively, the testing manager 815 may perform aspects of the functions described below using special-purpose hardware.

At 1105 the testing manager 815 may identify a first access line that is coupled with a ground reference. The first access line may be included in an apparatus that supports non-contact measurement of memory cell threshold voltage in accordance with embodiments of the present disclosure, such as the example of apparatus 400 or the example of apparatus 500. The operations of 1105 may be performed according to the methods described herein. In certain examples, aspects of the operations of 1105 may be performed by a structure identification component as described with reference to FIGS. 8 and 9.

At 1110 the testing manager 815 may identify a plurality of memory cells each coupled with the first access line and with a corresponding second access line of a plurality of second access lines. The operations of 1110 may be performed according to the methods described herein. In certain examples, aspects of the operations of 1110 may be performed by a structure identification component as described with reference to FIGS. 8 and 9.

At 1115 the testing manager 815 may set at least one second access line of the plurality of second access lines to a surface voltage by scanning the at least one second access line with an electron beam. The operations of 1115 may be performed according to the methods described herein. In certain examples, aspects of the operations of 1115 may be performed by an electron beam component as described with reference to FIGS. 8 and 9.

At 1120 the testing manager 815 may determine a threshold voltage of a corresponding memory cell of the plurality of memory cells based at least in part on setting the at least one second access line of the plurality of second access lines to the surface voltage. The operations of 1120 may be performed according to the methods described herein. In certain examples, aspects of the operations of 1120 may be performed by an analysis component as described with reference to FIGS. 8 and 9.

At 1125 the testing manager 815 may set the at least one second access line of the plurality of second access lines to a second surface voltage by scanning the at least one second access line with a second electron beam. The operations of 1125 may be performed according to the methods described herein. In certain examples, aspects of the operations of 1125 may be performed by an electron beam component as described with reference to FIGS. 8 and 9.

At 1130 the testing manager 815 may determine the threshold voltage of the corresponding memory cell of the plurality of memory cells based at least in part on setting the at least one second access line of the plurality of second access lines to the second surface voltage. The operations of 1130 may be performed according to the methods described herein. In certain examples, aspects of the operations of 1130 may be performed by an analysis component as described with reference to FIGS. 8 and 9.

Figure 12:
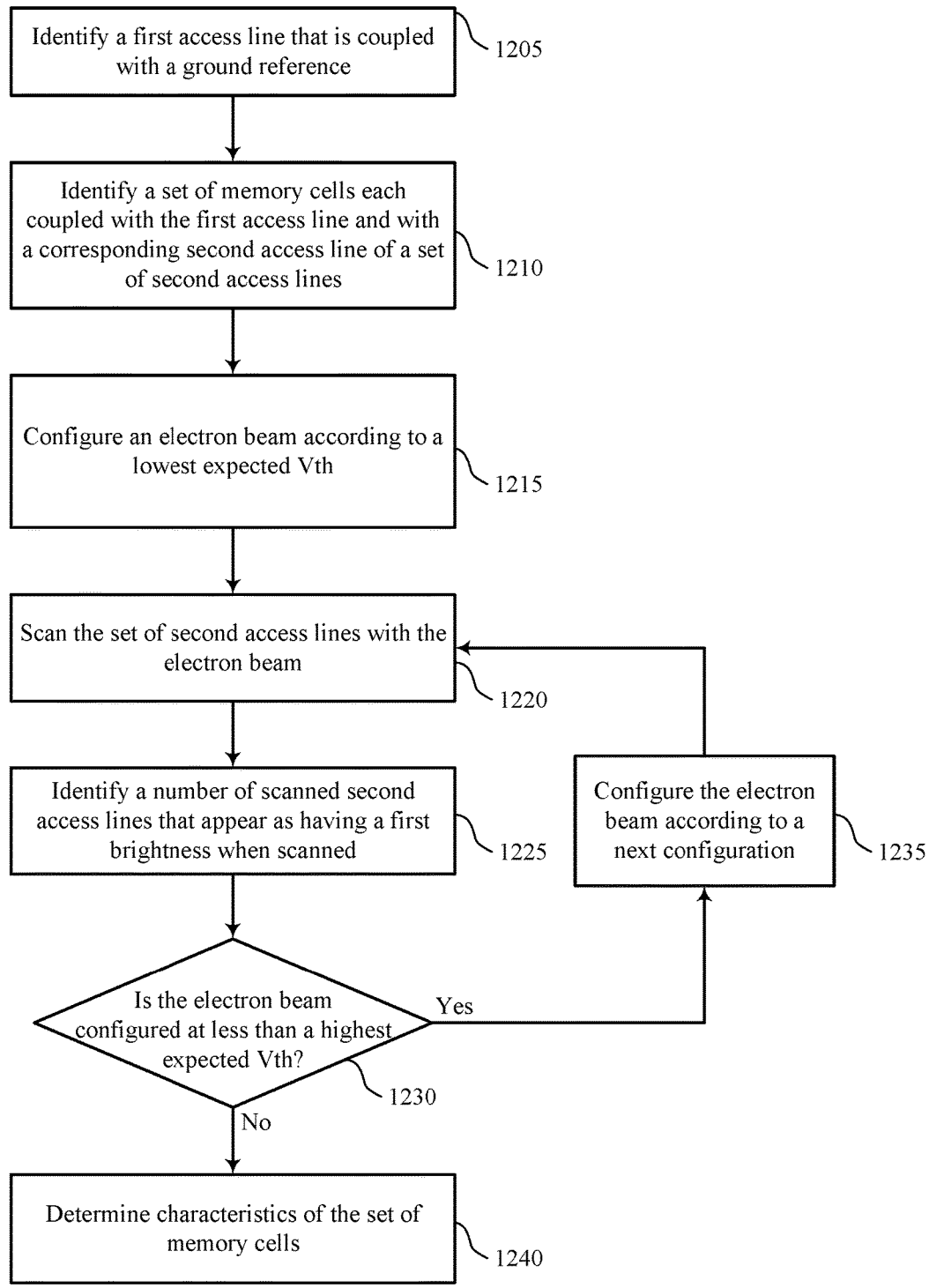

FIG. 12 shows a flowchart illustrating a method 1200 for non-contact measurement of memory cell threshold voltage in accordance with embodiments of the present disclosure. The operations of method 1200 may be implemented by a testing manager 815 or its components as described herein, among other examples. For example, the operations of method 1200 may be performed by a testing manager as described with reference to FIGS. 8 and 9. In some examples, a testing manager 815 may execute a set of codes to control the functional elements of one or more devices to perform the functions described below. Additionally or alternatively, the testing manager 815 may perform aspects of the functions described below using special-purpose hardware.

At 1205 the testing manager 815 may identify a first access line within a wafer that is coupled with a ground reference. The first access line may be included in an apparatus that supports non-contact measurement of memory cell threshold voltage in accordance with embodiments of the present disclosure, such as the example of apparatus 400 or the example of apparatus 500. The operations of 1205 may be performed according to the methods described herein. In certain examples, aspects of the operations of 1205 may be performed by a structure identification component as described with reference to FIGS. 8 and 9.

At 1210 the testing manager 815 may identify a plurality of memory cells each coupled with the first access line and with a corresponding second access line of a plurality of second access lines. The operations of 1210 may be performed according to the methods described herein. In certain examples, aspects of the operations of 1210 may be performed by a structure identification component as described with reference to FIGS. 8 and 9.

At 1215 the testing manager 815 may configure an electron beam according to a lowest expected Vth of the memory cells included in the plurality of memory cells identified at 1210. The testing manager 815 may configure the electron beam at 1215 by configuring the landing energy of the electron beam and/or the voltage of a Wehnelt electrode such that scanning a location on the surface of the wafer with the electron beam will generate a first desired surface voltage at the scanned location of the wafer. In certain examples, aspects of the operations of 1215 may be performed by an electron beam component as described with reference to FIGS. 8 and 9.

At 1220 the testing manager 815 may scan the plurality of second access lines corresponding to the plurality of memory cells identified at 1210 with the electron beam. In certain examples, aspects of the operations of 1220 may be performed by an electron beam component as described with reference to FIGS. 8 and 9.

At 1225 the testing manager 815 may identify a number of scanned second access lines that appear as having a first brightness (e.g., as relatively bright) when scanned (e.g., scanned at 1220). For example, the testing manager may configure an image analysis tool, such as an image analysis tool included in an EBI, to identify a number of the second access lines scanned at 1220 that appear as having at least the first brightness when scanned, and to also identify a number of the second access lines scanned at 1220 that appear as having a second brightness lower than the first brightness (e.g., as relatively dark) when scanned.

In some cases, the image analysis tool may identify as having the first brightness any second access line scanned at 1220 that appears with a brightness level at or above a brightness threshold level, and the image analysis tool may identify as having the second brightness any second access line scanned at 1220 that appears with a brightness level below the brightness threshold level. In accordance with the techniques described herein, a second access line may appear as having the first brightness when scanned at 1220 if a conductive path exists from the second access line to the ground reference, and thus a second access line may appear as having the first brightness when scanned at 1220 if the surface voltage created by the electron beam at 1220 meets or exceeds Vth for a memory cell coupled with the second access line.

Conversely, in accordance with the techniques described herein, a second access line may appear as having the second brightness (e.g., as dark, or not bright) when scanned at 1220 if a conductive path does not exist from the second access line to the ground reference, and thus a second access line may appear as having the second brightness when scanned at 1220 if the surface voltage created by the electron beam at 1220 is below Vth for a memory cell coupled with the second access line.

Thus, the number of second access lines scanned at 1220 that are identified as having the first brightness at 1225 may correspond to a number of memory cells for which the surface voltage created by the electron beam at 1220 exceeds Vth, and the number of second access lines scanned at 1220 that that are not identified as having the first brightness at 1225 may correspond to a number of memory cells for which the surface voltage created by the electron beam at 1220 does not exceed Vth. In certain examples, aspects of the operations of 1225 may be performed by an analysis component as described with reference to FIGS. 8 and 9.

At 1230 the testing manager 815 may determine whether the configuration of the electron beam (e.g., the configured landing energy of the electron beam and/or the configured voltage of the Wehnelt electrode) utilized at 1220 corresponds to a surface voltage less than a maximum expected Vth for the set of memory cells identified at 1210. In certain examples, aspects of the operations of 1230 may be performed by an electron beam component as described with reference to FIGS. 8 and 9.

If at 1230 the testing manager 815 determines that the configuration of the electron beam utilized at 1220 is for a surface voltage that is less than the maximum expected Vth for the set of memory cells identified at 1210, the testing manager 815 may proceed to 1235. At 1235 the testing manager 815 may configure the electron beam according to a next configuration. For example, the testing manager 815 may configure the electron beam at 1235 by configuring the landing energy of the electron beam and/or the voltage of a Wehnelt electrode such that scanning a location on the surface of the wafer with the electron beam will generate a next surface voltage at the scanned location of the wafer. The next surface voltage may in some cases be higher than the surface voltage created by the electron beam at 1220 by a fixed incremental amount. In certain examples, aspects of the operations of 1230 may be performed by an electron beam component as described with reference to FIGS. 8 and 9.

If at 1230 the testing manager 815 determines that the configuration of the electron beam utilized at 1220 is for a surface voltage that is greater than or equal to the maximum expected Vth for the set of memory cells identified at 1210, the testing manager 815 may proceed to 1240. At 1240 the testing manager 815 may determine characteristics of the memory cells identified at 1210. For example, the testing manager may at 1240 determine a value of Vth for one or more of the memory cells identified at 1210. For example, the testing manager may determine that Vth of a memory cell is less than or equal to the lowest corresponding surface voltage which the testing manager identified the corresponding second access line as having the first brightness at 1225. Further, the testing manager 815 may determine that any second access line that was not identified as having the first brightness at any instance of 1225 is either defective (e.g., not properly configured) or coupled with a memory cell having an undesirably high Vth. The testing manager 815 may also determine population characteristics (e.g., a distributions of Vth values and related statistical measures, such as average Vth value, median Vth value, minimum Vth value, maximum Vth values, etc.) for the memory cells identified at 1210. In certain examples, aspects of the operations of 1230 may be performed by an analysis component as described with reference to FIGS. 8 and 9. It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain and the unexposed regions may be removed.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   identifying a first access line that is coupled with a ground reference;

identifying a plurality of memory cells each coupled with the first access line and with a corresponding second access line of a plurality of second access lines;

setting at least one second access line of the plurality of second access lines to a surface voltage by scanning the at least one second access line with an electron beam; and determining a threshold voltage of a corresponding memory cell of the plurality of memory cells based at least in part on setting the at least one second access line of the plurality of second access lines to the surface voltage.

2. The method of claim 1, further comprising:

determining, based at least in part on scanning the at least one second access line with the electron beam, that the at least one second access line is coupled with the first access line, wherein determining the threshold voltage of the corresponding memory cell is based at least in part on determining that the at least one second access line is coupled with the first access line.

3. The method of claim 1, further comprising:

setting the at least one second access line of the plurality of second access lines to a second surface voltage by scanning the at least one second access line with a second electron beam; and determining the threshold voltage of the corresponding memory cell of the plurality of memory cells based at least in part on setting the at least one second access line of the plurality of second access lines to the second surface voltage.

* * * * *